(12) United States Patent
Shin et al.

(10) Patent No.: US 9,798,849 B2
(45) Date of Patent: Oct. 24, 2017

(54) METHODS OF DETECTING STRESSES, METHODS OF TRAINING COMPACT MODELS, METHODS OF RELAXING STRESSES, AND COMPUTING SYSTEMS

(71) Applicants: Jae-Pil Shin, Suwon-si (KR); Chang-Woo Kang, Gwacheon-si (KR); Jong-Won Kim, Hwaseong-si (KR); Ho-Joon Lee, Goyang-si (KR); Kyu-Baik Chang, Seoul (KR); Won-Young Chung, Hwaseong-si (KR)

(72) Inventors: Jae-Pil Shin, Suwon-si (KR); Chang-Woo Kang, Gwacheon-si (KR); Jong-Won Kim, Hwaseong-si (KR); Ho-Joon Lee, Goyang-si (KR); Kyu-Baik Chang, Seoul (KR); Won-Young Chung, Hwaseong-si (KR)

(73) Assignee: SAMSUNG EELECTRONICS CO., LTD., Gyeonggi-Do (KR)

( * ) Notice: Subject to any disclaimer, the term of this patent is extended or adjusted under 35 U.S.C. 154(b) by 221 days.

(21) Appl. No.: 14/688,440

(22) Filed: Apr. 16, 2015

(65) Prior Publication Data
US 2016/0012174 A1    Jan. 14, 2016

(30) Foreign Application Priority Data
Jul. 9, 2014    (KR) .................. 10-2014-0085953

(51) Int. Cl.
*G06F 9/455*    (2006.01)
*G06F 17/50*    (2006.01)

(52) U.S. Cl.
CPC ...... *G06F 17/5081* (2013.01); *G06F 17/5009* (2013.01)

(58) Field of Classification Search
USPC ...................................................... 716/112
See application file for complete search history.

(56) References Cited

U.S. PATENT DOCUMENTS

| | | |
|---|---|---|
| 6,462,962 B1 | 10/2002 | Cuk |
| 7,337,420 B2 | 2/2008 | Chidambarrao et al. |
| 7,761,278 B2 | 7/2010 | Chidambarrao et al. |
| 7,827,518 B2 | 11/2010 | Wu et al. |
| 8,037,433 B2 | 10/2011 | Chidambarrao et al. |
| 8,112,729 B2 | 2/2012 | Tonti et al. |
| 8,219,941 B2 | 7/2012 | Sinha et al. |
| 8,350,330 B2 | 1/2013 | Lu et al. |

(Continued)

FOREIGN PATENT DOCUMENTS

| | | |
|---|---|---|
| KR | 0827474 | 5/2008 |
| WO | WO-2007016183 A2 | 2/2007 |

*Primary Examiner* — Bryce Aisaka
(74) *Attorney, Agent, or Firm* — Harness, Dickey & Pierce, PLC

(57) ABSTRACT

A method of detecting stress of an integrated circuit including first and second patterns formed from different materials may comprise: determining one or more stress detection points of the first pattern; dividing a region including a first stress detection point of the one or more stress detection points into a plurality of divided regions; calculating areas of the second pattern at the divided regions; and/or detecting a stress level applied to the first stress detection point of the first pattern by the second pattern based on the areas of the second pattern at the divided regions.

20 Claims, 18 Drawing Sheets

(56) References Cited

U.S. PATENT DOCUMENTS

| | | |
|---|---|---|
| 8,453,101 B1 | 5/2013 | Johnson et al. |
| 8,615,728 B2 | 12/2013 | Moroz et al. |
| 8,661,398 B1 | 2/2014 | Moroz et al. |
| 2009/0288048 A1* | 11/2009 | Moroz ................ G06F 17/5036 716/136 |
| 2012/0168866 A1* | 7/2012 | Anderson ......... H01L 21/82341 257/351 |

* cited by examiner

○ CONVEX POINT
□ CONCAVE POINT
× PROJECTED POINT

FIG. 3
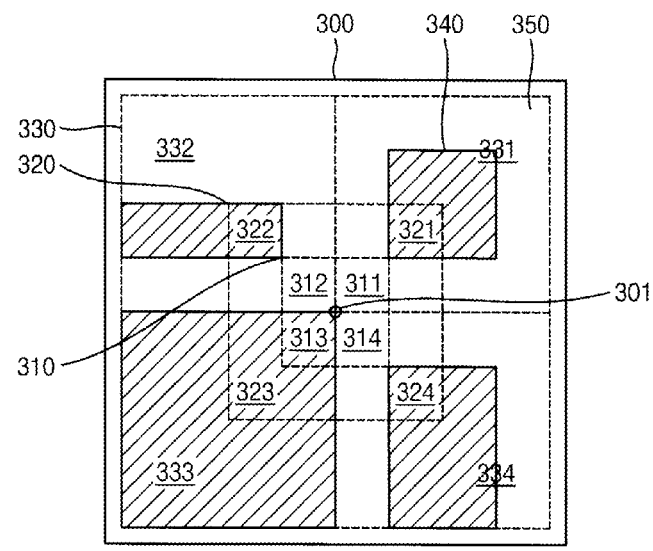
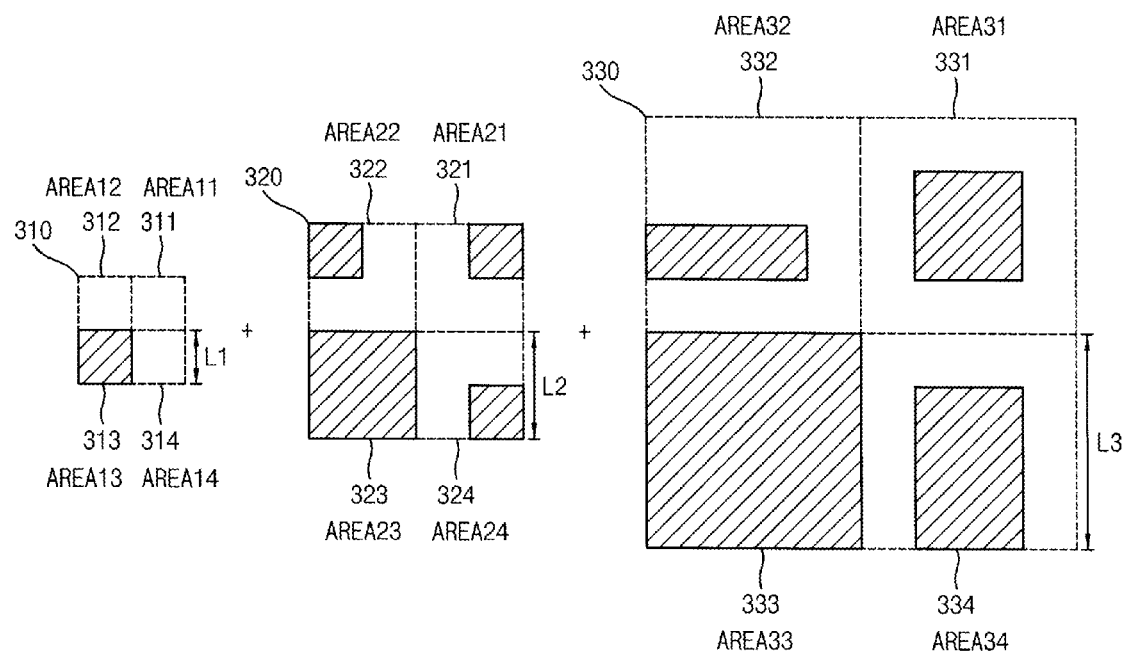

STRESS = C0 +
    C11*AREA11 + C12*AREA12 + C13*AREA13 + C14*AREA14 +
    C21*AREA21 + C22*AREA22 + C23*AREA23 + C24*AREA24 +
    C31*AREA31 + C32*AREA32 + C33*AREA33 + C34*AREA34

598MPa

635MPa

625MPa

632MPa

661MPa
≈
598+37+27MPa
(662MPa)

670MPa
≈
598+37+34MPa
(669MPa)

STRESS = C0 +
C11*AREA11 + C12*AREA12 + C13*AREA13 + C14*AREA14 +
C111*AREA11^2 + C112*AREA11*AREA12 + C113*AREA11*AREA13 + C114*AREA11*AREA14 +
C122*AREA12^2 + C123*AREA12*AREA13 + C124* AREA12*AREA14 +
C133*AREA13^2 + C134*AREA13*AREA14 + C144* AREA14^2 +
C21*AREA21 + C22*AREA22 + C23*AREA23 + C24*AREA24 +
C211*AREA21^2 + C212*AREA21*AREA22 + C213*AREA21*AREA23 + C214*AREA21*AREA24 +
C222*AREA22^2 + C223*AREA22*AREA23 + C224* AREA22*AREA24 +
C233*AREA23^2 + C234*AREA23*AREA24 + C244* AREA24^2 +
C31*AREA31 + C32*AREA32 + C33*AREA33 + C34*AREA34 +
C311*AREA31^2 + C312*AREA31*AREA32 + C313*AREA31*AREA33 + C314*AREA31*AREA34 +
C322*AREA32^2 + C323*AREA32*AREA33 + C324* AREA32*AREA34 +
C333*AREA33^2 + C334*AREA33*AREA34 + C344* AREA34^2

RING TYPE DUMMY PATTERN

RECTANGLE TYPE DUMMY PATTERN

POLYGON TYPE DUMMY PATTERN

ATTACHED TYPE DUMMY PATTERN

METHODS OF DETECTING STRESSES, METHODS OF TRAINING COMPACT MODELS, METHODS OF RELAXING STRESSES, AND COMPUTING SYSTEMS

CROSS-REFERENCE TO RELATED APPLICATION(S)

This application claims priority from Korean Patent Application No. 10-2014-0085953, filed on Jul. 9, 2014, in the Korean Intellectual Property Office (KIPO), the entire contents of which are incorporated herein by reference.

BACKGROUND

1. Field

Example embodiments may relate generally to semiconductor circuit designs and verifications. Example embodiments may relate generally to methods of detecting stresses, methods of training compact models, methods of relaxing stresses, and/or computing systems.

2. Description of Related Art

In semiconductor circuits, such as integrated circuits, adjacent patterns may be formed from different materials. In cases where the materials of these adjacent patterns (e.g., an active pattern and an isolation layer pattern) have different expansion coefficients (or different coefficients of thermal expansion), each pattern may be under stress, and defects, such as standby leakage currents or cracks, may be caused by dislocation of one or more patterns.

SUMMARY

Some example embodiments may provide methods of detecting stresses of integrated circuits when verifying designs of the integrated circuits.

Some example embodiments may provide computing systems for detecting stresses of integrated circuits when verifying designs of the integrated circuits.

Some example embodiments may provide methods of training compact models for detecting stresses of integrated circuits.

Some example embodiments may provide computing systems for training compact models for detecting stresses of integrated circuits.

Some example embodiments may provide methods of relaxing stresses of integrated circuits.

Some example embodiments may provide computing systems for relaxing stresses of integrated circuits.

In some example embodiments, a method of detecting stress of an integrated circuit including first and second patterns formed from different materials may comprise: determining one or more stress detection points of the first pattern; dividing a region including a first stress detection point of the one or more stress detection points into a plurality of divided regions; calculating areas of the second pattern at the divided regions; and/or detecting a stress level applied to the first stress detection point of the first pattern by the second pattern based on the areas of the second pattern at the divided regions.

In some example embodiments, the first stress detection point may include at least one selected from a convex point, a concave point, and a projected point of the first pattern.

In some example embodiments, the determining of the one or more stress detection points and the detecting of the stress level may be performed throughout a whole region of the integrated circuit.

In some example embodiments, the dividing of the region including the first stress detection point into the plurality of divided regions may include: determining a rectangular shaped region having the first stress detection point as a central point; and/or dividing the rectangular shaped region into first through fourth divided regions.

In some example embodiments, the detecting of the stress level may include: calculating, as the stress level, a sum of a first coefficient, a product of a second coefficient and the area of the second pattern at the first divided region, a product of a third coefficient and the area of the second pattern at the second divided region, a product of a fourth coefficient and the area of the second pattern at the third divided region, and a product of a fifth coefficient and the area of the second pattern at the fourth divided region.

In some example embodiments, the dividing of the region including the first stress detection point into the plurality of divided regions may include: determining N rectangular shaped regions having different sizes such that each of the N rectangular shaped regions has the first stress detection point as a central point, where N is an integer greater than 0; and/or dividing each of the N rectangular shaped regions into M divided regions, where M is an integer greater than 1.

In some example embodiments, the detecting of the stress level may include: calculating the stress level by using an L-th order equation of the areas of the second pattern at the divided regions, where L is an integer greater than 0.

In some example embodiments, the dividing of the region including the first stress detection point into the plurality of divided regions may include: determining N circular shaped regions having different sizes such that each of the N circular shaped regions has the first stress detection point as a central point, where N is an integer greater than 0; and/or dividing each of the N circular shaped regions into M divided regions, where M is an integer greater than 1.

In some example embodiments, the first pattern may be an active pattern. The second pattern may be an isolation layer pattern. The stress level applied to the first stress detection point of the active pattern by the isolation layer pattern may be detected.

In some example embodiments, a computing system that is configured to detect stress of an integrated circuit including first and second patterns formed from different materials may comprise: a memory device into which layout data for the integrated circuit and a stress detection tool for detecting the stress of the integrated circuit are loaded; and/or a processor configured to execute the stress detection tool loaded into the memory device. The stress detection tool executed by the processor may be configured to determine one or more stress detection points of the first pattern based on the layout data, may be configured to divide a region including a first stress detection point of the one or more stress detection points into a plurality of divided regions, may be configured to calculate areas of the second pattern at the divided regions, and/or may be configured to detect a stress level applied to the first stress detection point of the first pattern by the second pattern based on the areas of the second pattern at the divided regions.

In some example embodiments, the stress detection tool may include: a point determining module configured to determine the first stress detection point of the first pattern based on the layout data; and/or a stress detecting module configured to divide the region including the first stress detection point into the divided regions, configured to calculate the areas of the second pattern at the divided regions, and/or configured to detect the stress level applied to the first stress detection point of the first pattern by the second pattern based on the areas of the second pattern at the divided regions.

In some example embodiments, the stress detection tool executed by the processor may be configured to add a layer representing the stress level to the layout data.

In some example embodiments, a method of training a compact model for detecting stress of an integrated circuit may comprise: performing compact model-based stress simulation using the compact model on the integrated circuit to extract a stress distribution of the integrated circuit; selecting sample stress detection points based on the stress distribution of the integrated circuit; performing rigorous stress simulation on the sample stress detection points; and/or calibrating the compact model based on a result of the rigorous stress simulation.

In some example embodiments, the compact model-based stress simulation may be a full-chip stress simulation for the integrated circuit. The stress distribution of the integrated circuit may be a full-chip stress distribution of the integrated circuit. The sample stress detection points may be selected based on the full-chip stress distribution of the integrated circuit.

In some example embodiments, the sample stress detection points may be selected such that a distribution of the sample stress detection points has a shape substantially the same as a shape of the stress distribution.

In some example embodiments, the performing of the compact model-based stress simulation using the compact model may include: determining, in the integrated circuit including first and second patterns formed from different materials, one or more stress detection points of the first pattern; dividing a region including a first stress detection point of the one or more stress detection points into a plurality of divided regions based on the compact model; calculating areas of the second pattern at the divided regions; and/or detecting a stress level applied to the first stress detection point of the first pattern by the second pattern by using the compact model based on the areas of the second pattern at the divided regions.

In some example embodiments, the first stress detection point may include at least one selected from a convex point, a concave point, and a projected point of the first pattern.

In some example embodiments, the compact model may correspond to an L-th order equation of the areas of the second pattern at the divided regions, where L is an integer greater than 0.

In some example embodiments, the calibrating of the compact model based on the result of the rigorous stress simulation may include: calibrating at least one coefficient of the L-th order equation based on the result of the rigorous stress simulation.

In some example embodiments, a computing system that is configured to train a compact model for detecting stress of an integrated circuit may comprise: a memory device into which layout data for the integrated circuit, the compact model, a stress detection tool for detecting the stress of the integrated circuit, and a training tool for training the compact model are loaded; and/or a processor configured to execute the stress detection tool and the training tool loaded into the memory device. The stress detection tool executed by the processor may be configured to perform compact model-based stress simulation using the compact model on the integrated circuit to extract a stress distribution of the integrated circuit. The training tool executed by the processor may be configured to select sample stress detection points based on the stress distribution of the integrated circuit, may be configured to perform rigorous stress simulation on the sample stress detection points, and/or may be configured to calibrate the compact model based on a result of the rigorous stress simulation.

In some example embodiments, a method of relaxing stress of an integrated circuit including first and second patterns formed from different materials may comprise: determining one or more stress detection points of the first pattern; dividing a region including a first stress detection point of the one or more stress detection points into a plurality of divided regions; calculating areas of the second pattern at the divided regions; detecting a stress level applied to the first stress detection point of the first pattern by the second pattern based on the areas of the second pattern at the divided regions; and/or inserting a dummy pattern near the first stress detection point of the first pattern when the detected stress level is greater than a desired value.

In some example embodiments, the dummy pattern may include at least one selected from a ring type dummy pattern, a rectangle type dummy pattern, a polygon type dummy pattern, and an attached type dummy pattern.

In some example embodiments, a computing system configured to relax stress of an integrated circuit including first and second patterns formed from different materials may comprise: a memory device into which layout data for the integrated circuit, a stress detection tool for detecting the stress of the integrated circuit, and a stress relaxation tool for relaxing the detected stress are loaded; and/or a processor configured to execute the stress detection tool and the stress relaxation tool loaded into the memory device. The stress detection tool executed by the processor may be configured to determine one or more stress detection points of the first pattern based on the layout data, may be configured to divide a region including a first stress detection point of the one or more stress detection points into a plurality of divided regions, may be configured to calculate areas of the second pattern at the divided regions, and/or may be configured to detect a stress level applied to the first stress detection point of the first pattern by the second pattern based on the areas of the second pattern at the divided regions. The stress relaxation tool executed by the processor may be configured to insert a dummy pattern near the first stress detection point of the first pattern when the detected stress level is greater than a desired value.

In some example embodiments, a method of detecting stress of an integrated circuit including patterns of different materials may comprise: determining a first stress detection point of a first pattern; dividing a first region of the integrated circuit, including the first stress detection point, into divided first regions; calculating areas of a second pattern in the divided first regions; and/or detecting the stress applied to the first stress detection point by the second pattern based on the areas of the second pattern in the divided first regions.

In some example embodiments, the first stress detection point may comprise a convex point of the first pattern, a concave point of the first pattern, or a projected point of the first pattern.

In some example embodiments, the method may further comprise: determining a second stress detection point of the first pattern; dividing a second region of the integrated circuit, including the second stress detection point, into divided second regions; calculating areas of the second pattern in the divided second regions; and/or detecting the stress applied to the second stress detection point by the second pattern based on the areas of the second pattern in the divided second regions.

In some example embodiments, the second stress detection point may comprise a convex point of the first pattern, a concave point of the first pattern, or a projected point of the first pattern.

In some example embodiments, the first region and the second region may overlap.

In some example embodiments, the first region and the second region may not overlap.

In some example embodiments, at least one of the divided first regions may overlap at least one of the divided second regions.

In some example embodiments, none of the divided first regions may overlap any of the divided second regions.

In some example embodiments, the detecting of the stress applied to the first stress detection point may comprise: calculating the stress as a sum of a first coefficient and products of second coefficients and the areas of the second pattern at the divided first regions.

In some example embodiments, the detecting of the stress applied to the first stress detection point may comprise: calculating the stress by using an L-th order equation of the areas of the second pattern at the divided first regions, where L is an integer greater than 0.

In some example embodiments, the dividing of the first region of the integrated circuit into the divided first regions may comprise: determining N regions having different sizes such that each of the N regions has the first stress detection point as a central point, where N is an integer greater than 0; and/or dividing each of the N regions into M divided first regions, where M is an integer greater than 1.

BRIEF DESCRIPTION OF THE DRAWINGS

The above and/or other aspects and advantages will become more apparent and more readily appreciated from the following detailed description of example embodiments, taken in conjunction with the accompanying drawings, in which:

FIG. 3 is a diagram for describing an example of a step of dividing a region including a stress detection point in a method of detecting stress according to some example embodiments;

FIG. 6 is a diagram illustrating another example of a compact model used in a method of detecting stress according to some example embodiments;

DETAILED DESCRIPTION

Figure 1:
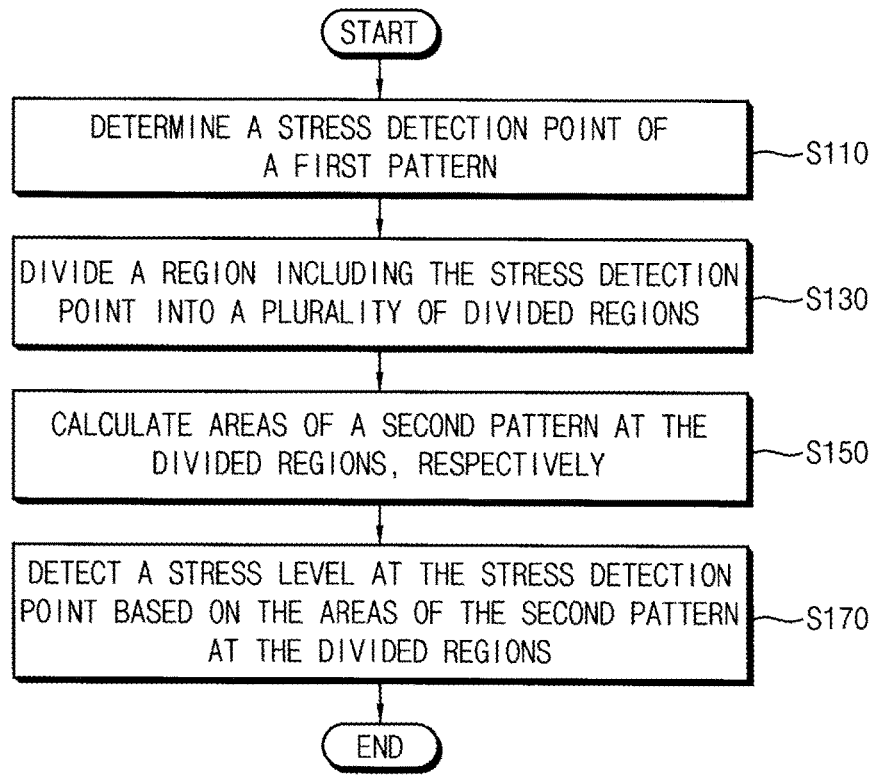
FIG. 1 is a flowchart illustrating a method of detecting stress of an integrated circuit according to some example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Reference will now be made to example embodiments, which are illustrated in the accompanying drawings, wherein like reference numerals may refer to like components throughout.

Figure 2:
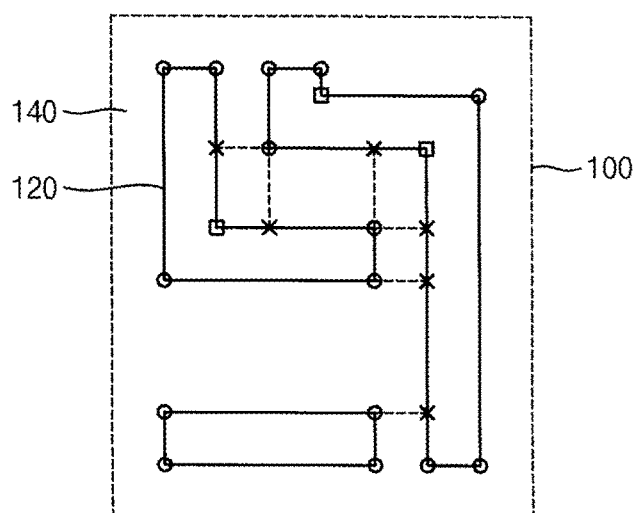
FIG. 2 is a diagram for describing a step of determining a stress detection point in a method of detecting stress according to some example embodiments.

FIG. 1 is a flowchart illustrating a method of detecting stress of an integrated circuit according to some example embodiments, and FIG. 2 is a diagram for describing a step of determining a stress detection point in a method of detecting stress according to some example embodiments.

Referring to FIG. 1, in an integrated circuit including first and second patterns that are formed from different materials, at least one stress detection point of the first pattern may be determined (S110). In some example embodiments, the first pattern may be one of an active pattern, an isolation layer pattern, a gate pattern, a poly-silicon pattern, or an epitaxial layer pattern, and the second pattern may be another one of the patterns different from the first pattern. For example, the first pattern may be the active pattern, and the second pattern may be the isolation layer pattern.

In some example embodiments, a convex point, a concave point, or a projected point of the first pattern may be determined as the stress detection point. Here, the convex point of the first pattern may mean a convex corner of the first pattern, the concave point of the first pattern may mean a concave corner of the first pattern, and the projected point of the first pattern may mean a point on which an adjacent convex point is projected. At the projected point, a gap with respect to an adjacent region of the first pattern may be changed.

Referring to FIG. 2, in a region 100 of an integrated circuit, a first pattern 120, and a second pattern 140 may be adjacent to each other, and may be formed from different materials. For example, the first pattern 120 may be an active pattern formed from silicon, and the second pattern 140 may be an isolation layer pattern formed from silicon oxide ($SiO_2$) by a shallow trench isolation (STI) process. In this case, as illustrated in FIG. 2, convex points (indicated by "O"), concave points (indicated by "□"), and projected points (indicated by "X") of the first pattern 120 may be determined as the stress detection points.

In some example embodiments, the determination of the stress detection points may be performed throughout the whole region of the integrated circuit, and stress levels at the stress detection points may be detected throughout the whole region of the integrated circuit. For example, all convex points, all concave points, and all projected points of the first pattern in the whole region of the integrated circuit may be determined as the stress detection points, and the stress levels at all convex points, all concave points, and all projected points may be detected. That is, a full-chip stress simulation for detecting stress throughout the whole region of the integrated circuit may be performed.

Referring again to FIG. 1, a region including each stress detection point may be divided into a plurality of divided regions (S130). In some example embodiments, with respect to each stress detection point, a region having the stress detection point as the central point and having any shape, such as a rectangular shape, a polygonal shape, a circular shape, etc. may be determined, and the determined region may be divided into the plurality of divided regions. Further, in some example embodiments, with respect to each stress detection point, one or more regions having the stress detection point as the central point and having different sizes may be determined, and each of the one or more regions may be divided into the plurality of divided regions. For example, N rectangular shaped regions having different sizes may be determined such that each of the N rectangular shaped regions has the stress detection point as the central point, and each of the N rectangular shaped regions may be substantially equally divided into M divided regions, where N is an integer greater than 0 and M is an integer greater than 1. In an another example, N circular shaped regions having different sizes may be determined such that each of the N circular shaped regions has the stress detection point as the central point, and each of the N circular shaped regions may be substantially equally divided into M divided regions.

Areas of the second pattern may be calculated at the divided regions, respectively (S150). For example, the areas of the second pattern at the divided regions may be calculated from layout data of the integrated circuit. A stress level applied to the stress detection point of the first pattern by the second pattern may be detected based on the areas of the second pattern at the divided regions (S170). In some example embodiments, the stress level at the stress detection point may be calculated by using an L-th order equation of the areas of the second pattern at the divided regions (e.g., M*N divided regions generated by dividing each of N regions into M divided regions), where L is an integer greater than 0. For example, in a case where N is 1 and M is 4, a rectangular shaped region having the stress detection point as the central point may be substantially equally divided into first through fourth divided regions, and the stress level at the stress detection point may be detected by calculating a sum of a first coefficient (or constant), a product of a second coefficient and the area of the second pattern at the first divided region, a product of a third coefficient and the area of the second pattern at the second divided region, a product of a fourth coefficient and the area of the second pattern at the third divided region, and a product of a fifth coefficient and the area of the second pattern at the fourth divided region. Since the L-th order equation of the areas of the second pattern at the divided regions uses the areas to calculate the stress level, the L-th order equation may require relatively few calculations, and may be rapidly processed. Accordingly, the L-th order equation may be referred to as a "compact model" or an "area-based compact model" for detecting the stress of the integrated circuit.

In a semiconductor circuit such as an integrated circuit, adjacent patterns may be formed from different materials. In a case where the materials of these adjacent patterns have different expansion coefficients (or different coefficients of thermal expansion), each pattern may be under stress, and a defect, such as a standby leakage current or a crack, may be caused by dislocation of each pattern. To prevent this standby leakage current or crack, a stress simulation may be performed to detect the stress of the integrated circuit when verifying a design of the integrated circuit. A rigorous stress simulation using a finite element method (FEM) or a finite analytic method (FAM) may require relatively many calculations and, thus, the rigorous stress simulation may require a long processing time. Accordingly, the rigorous stress simulation can be performed only on a small part of the integrated circuit. However, the method of detecting the stress using the compact model according to some example embodiments may have a short processing time since the compact model may require relatively few calculations and, thus, can detect stress levels at all stress detection points throughout the whole region of the integrated circuit. That is, by the method of detecting the stress using the compact model according to some example embodiments, the full-chip stress simulation that detects the stress throughout the whole region of the integrated circuit may be performed.

Further, a conventional stress simulation is performed to prevent degradation of a performance of an element (e.g., mobility of a transistor). However, the method of detecting the stress using the compact model according to some example embodiments may be performed to prevent an occurrence of a dislocation or a crack between adjacent patterns having different materials.

As described above, the method of detecting the stress according to some example embodiments may detect the stress level at each stress detection point by using an equation of the areas of the second pattern at the divided regions, or by using the area-based compact model. Accordingly, the method of detecting the stress according to some example embodiments may be rapidly performed, and the full-chip stress simulation that detects the stress throughout the whole region of the integrated circuit may be performed.

Figure 4:
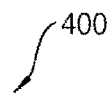
FIG. 4 is a diagram illustrating an example of a compact model used in a method of detecting stress according to some example embodiments.

FIG. 3 is a diagram for describing an example of a step of dividing a region including a stress detection point in a method of detecting stress according to some example embodiments, FIG. 4 is a diagram illustrating an example of a compact model used in a method of detecting stress according to some example embodiments, FIGS. 5A-5G are diagrams for describing an example of a principle of superposition that may be used in a method of detecting stress according to some example embodiments, and FIG. 6 is a diagram illustrating another example of a compact model used in a method of detecting stress according to some example embodiments.

Referring to FIG. 3, in a region 300 of an integrated circuit, a first pattern 340 and a second pattern 350 may be adjacent to each other, and may be formed from different materials. For example, the first pattern 120 may be an active pattern formed from silicon, and the second pattern 140 may be an isolation layer pattern formed from silicon oxide by a STI process. At each stress detection point 301, a stress level applied to the active pattern by the isolation layer pattern may be detected.

To detect the stress level at each stress detection point 301, N rectangular shaped regions 310, 320, and 330 having different sizes may be determined such that each of the N rectangular shaped regions 310, 320, and 330 has the stress detection point 301 as the central point, and each of the N rectangular shaped regions 310, 320, and 330 may be substantially equally divided into M divided regions 311, 312, 313, 314, 321, 322, 323, 324, 331, 332, 333, and 334, where N is an integer greater than 0 and M is an integer greater than 1. For example, a first region 310 having a first size may be substantially equally divided into first through fourth divided regions 311, 312, 313, and 314; a second region 320 having a second size greater than the first size may be substantially equally divided into fifth through eighth divided regions 321, 322, 323, and 324; and a third region 330 having a third size greater than the second size may be substantially equally divided into ninth through twelfth divided regions 331, 332, 333, and 334. In an example, a length L1 of each side of each of the first through fourth divided regions 311, 312, 313, and 314 may range from about 30 nanometers (nm) to about 500 nm; a length L2 of each side of each of the fifth through eighth divided regions 321, 322, 323, and 324 may range from about 500 nm to about 1.5 microns (μm); and a length L3 of each side of each of the ninth through twelfth divided regions 331, 332, 333, and 334 may range from about 1.5 μm to about 3 μm.

First through twelfth areas AREA11, AREA12, AREA13, AREA14, AREA21, AREA22, AREA23, AREA24, AREA31, AREA32, AREA33, and AREA34 of the second pattern 350 at the first through twelfth divided regions 311, 312, 313, 314, 321, 322, 323, 324, 331, 332, 333, and 334 may be calculated from layout data for the integrated circuit. Further, a stress level at the stress detection point 301 may be calculated by using an L-th order equation of the first through twelfth areas AREA11, AREA12, AREA13, AREA14, AREA21, AREA22, AREA23, AREA24, AREA31, AREA32, AREA33, and AREA34 of the second pattern 350 at the first through twelfth divided regions 311, 312, 313, 314, 321, 322, 323, 324, 331, 332, 333, and 334, where L is an integer greater than 0.

In some example embodiments, the stress level at the stress detection point 301 may be calculated by using a first-order equation 400 illustrated in FIG. 4. For example, as illustrated in FIG. 4, the stress level STRESS at the stress detection point 301 may be calculated by calculating a sum of a first coefficient CO, a product C11*AREA11 of a second coefficient and the first area, a product C12*AREA12 of a third coefficient and the second area, a product C13*AREA13 of a fourth coefficient and the third area, a product C14*AREA14 of a fifth coefficient and the fourth area, a product C21*AREA21 of a sixth coefficient and the fifth area, a product C22*AREA22 of a seventh coefficient and the sixth area, a product C23*AREA23 of an eighth coefficient and the seventh area, a product C24*AREA24 of a ninth coefficient and the eighth area, a product C31*AREA31 of a tenth coefficient and the ninth area, a product C32*AREA32 of an eleventh coefficient and the tenth area, a product C33*AREA33 of a twelfth coefficient and the eleventh area, and a product C34*AREA34 of a thirteenth coefficient and the twelfth area. This first-order equation 400, or the division of the region 300 having the stress detection point 301 at the center and the first-order equation 400, may be referred to as a "compact model" or an "area-based compact model" for detecting the stress of the integrated circuit.

Figure 5A:
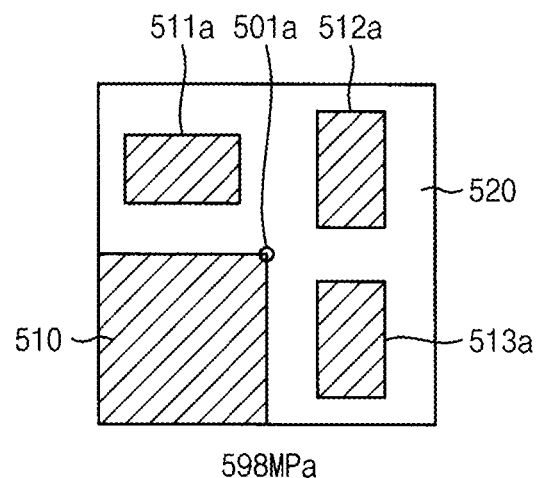
FIGS. 5A-G are diagrams for describing an example of a principle of superposition that may be used in a method of detecting stress according to some example embodiments.
Figure 5B:
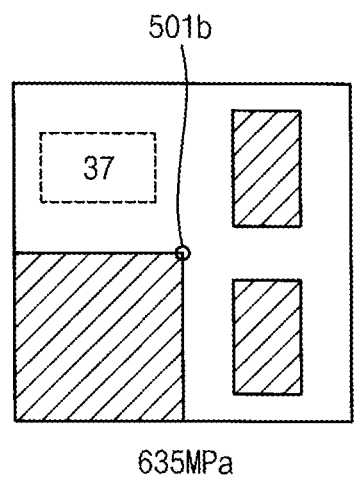
Figure 5C:
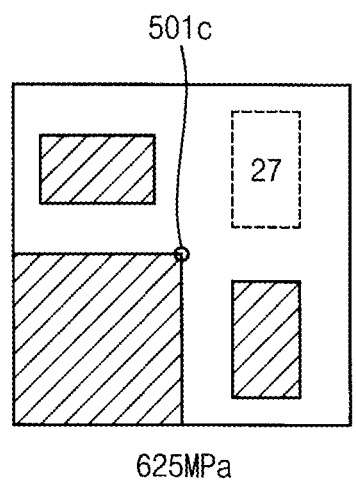
Figure 5D:
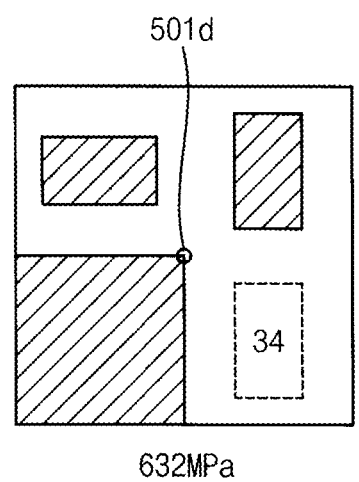
Figure 5E:
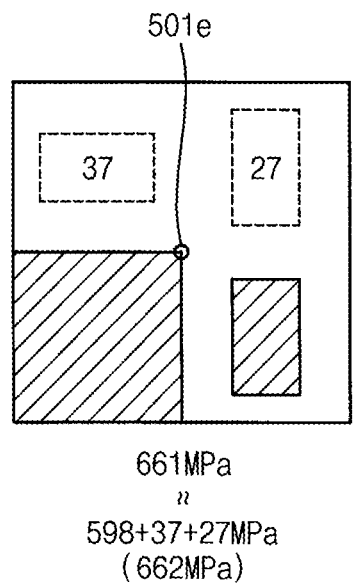
Figure 5F:
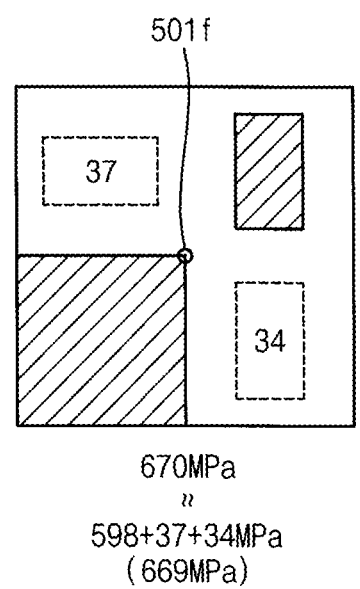
Figure 5G:
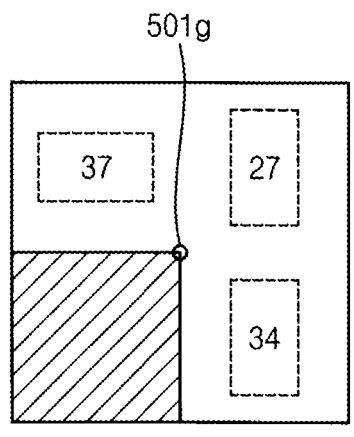

As illustrated in FIGS. 5A-5G, in calculating a stress level at each stress detection point 501a, a principle of superposition may be applied. For example, in a case where first through third regions 511a, 512a, and 513a of a first pattern 510 are located near a stress detection point 501a of the first pattern 510, the stress detection point 501a may have a stress level of about 598 megapascals (MPa), as illustrated in FIG. 5A. With respect to this example, the stress level at the stress detection point 501b may be increased by about 37 MPa in a case where the first region 511a of the first pattern 510 is removed and a second pattern 520 is disposed at the removed region as illustrated in FIG. 5B, the stress level at the stress detection point 501c may be increased by about 27 MPa in a case where the second region 512a of the first pattern 510 is removed and the second pattern 520 is disposed at the removed region as illustrated in FIG. 5C, and the stress level at the stress detection point 501d may be increased by about 34 MPa in a case where the third region 513a of the first pattern 510 is removed and the second pattern 520 is disposed at the removed region as illustrated in FIG. 5D. Further, in a case where the first and second regions 511a and 512a of the first pattern 510 are removed and the second pattern 520 is disposed at the removed region as illustrated in FIG. 5E, the stress level at the stress detection point 501e may be calculated by adding an increment of the stress level when the first region 511a is removed, or about 37 MPa and an increment of the stress level when the second region 512a is removed, or about 27 MPa according to the principle of superposition, which may be substantially the same as or similar to an actual stress level of about 661 MPa. In a case where the first and third regions 511a and 513a of the first pattern 510 are removed and the second pattern 520 is disposed at the removed region as illustrated in FIG. 5F, the stress level at the stress detection point 501f may be calculated by adding an increment of the stress level when the first region 511a is removed, or about 37 MPa and an increment of the stress level when the third region 513a is removed, or about 34 MPa according to the principle of superposition, which may be substantially the same as or similar to an actual stress level of about 670 MPa. In a case where the first through third regions 511a, 512a, and 513a of the first pattern 510 are removed and the second pattern 520 is disposed at the removed region as illustrated in FIG. 5G, the stress level at the stress detection point 501g may be calculated by adding an increment of the stress level when the first region 511a is removed, or about 37 MPa, an increment of the stress level when the second region 512a is removed, or about 27 MPa, and an increment of the stress level when the third region 513a is removed, or about 34 MPa according to the principle of superposition, which may be substantially the same as or similar to an actual stress level of about 694 MPa. As described above, the principle of superposition is applied in calculating the stress level, or the stress level is linearly increased or decreased according to whether the second pattern 520 exists or not, which may mean that the stress level at each stress detection point may be accurately detected by using the first-order equation 400 illustrated in FIG. 4. Further, in some example embodiments, the stress levels may be calculated at some stress detection points and, with respect to other stress detection points, the stress levels may be calculated by adding or subtracting the calculated stress levels using the principle of superposition.

In some example embodiments, the stress level at the stress detection point 301 may be calculated by using a second-order equation 600 illustrated in FIG. 6. For example, as illustrated in FIG. 6, the stress level STRESS at the stress detection point 301 may be calculated by calculating a sum of a coefficient CO (or a constant), first-order terms of the areas of the second pattern 520 (e.g., C11*AREA11, C12*AREA12, C13*AREA13, C14*AREA14, C21*AREA21, C22*AREA22, C23*AREA23, C24*AREA24, C31*AREA31, C32*AREA32, C33*AREA33 and C34*AREA34), and second-order terms of the areas of the second pattern 520 (e.g., C111*AREA11^2, C112*AREA11*AREA12, C113*AREA11*AREA13, C114*AREA11*AREA14, C122*AREA12^2, C123*AREA12*AREA13, C124*AREA12*AREA14, C133*AREA13^2, C134*AREA13*AREA14, C144*AREA14^2, C211*AREA21^2, C212*AREA21*AREA22, C213*AREA21*AREA23, C214*AREA21*AREA24, C222*AREA22^2, C223*AREA22*AREA23, C224*AREA22*AREA24, C233*AREA23^2, C234*AREA23*AREA24, C244*AREA24^2, C311*AREA31^2, C312*AREA31*AREA32, C313*AREA31*AREA33, C314*AREA31*AREA34, C322*AREA32^2, C323*AREA32*AREA33, C324*AREA32*AREA34, C333*AREA33^2, C334*AREA33*AREA34 and C344*AREA34^2). Further, in some example embodiments, the stress level at the stress detection point 301 may be calculated by using a third-order equation or a higher-order equation.

As described above, in the method of detecting the stress according to some example embodiments, the stress level at each stress detection point may be calculated using the compact model illustrated in FIG. 4 or FIG. 6. Accordingly, the method of detecting the stress according to some example embodiments may be rapidly performed, and a full-chip stress simulation for detecting stress throughout the whole region of the integrated circuit may be performed.

Figure 7:
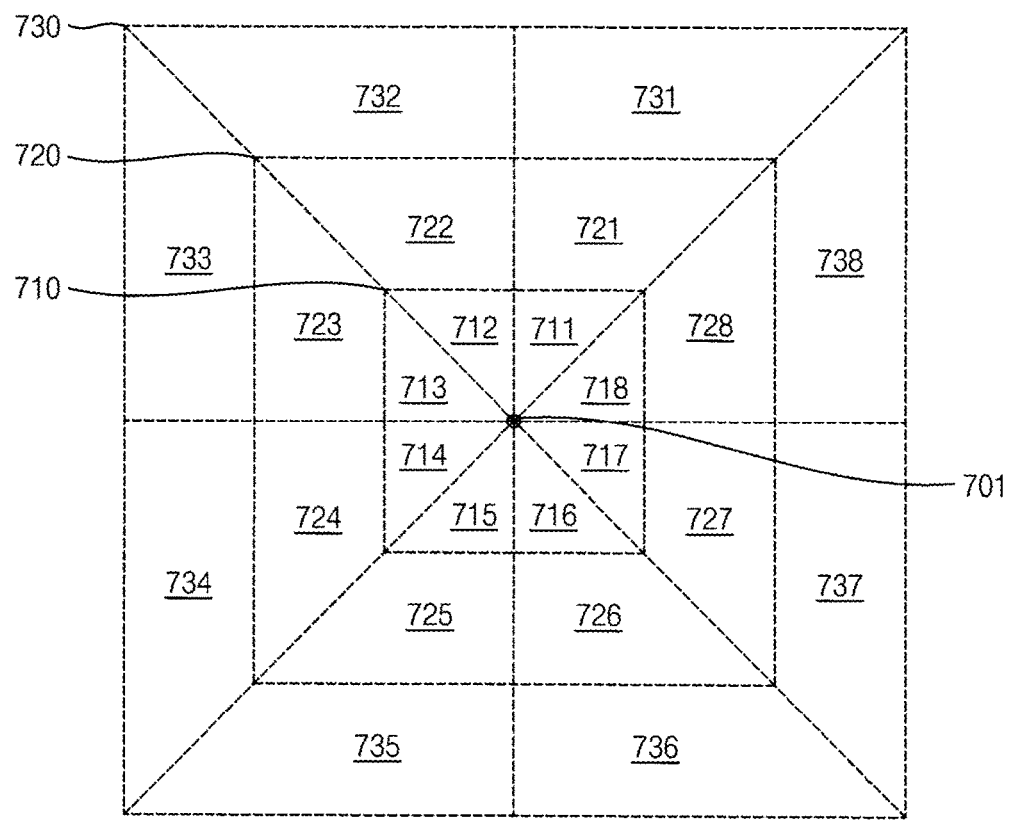
FIG. 7 is a diagram for describing another example of a step of dividing a region including a stress detection point in a method of detecting stress according to some example embodiments.
Figure 8:
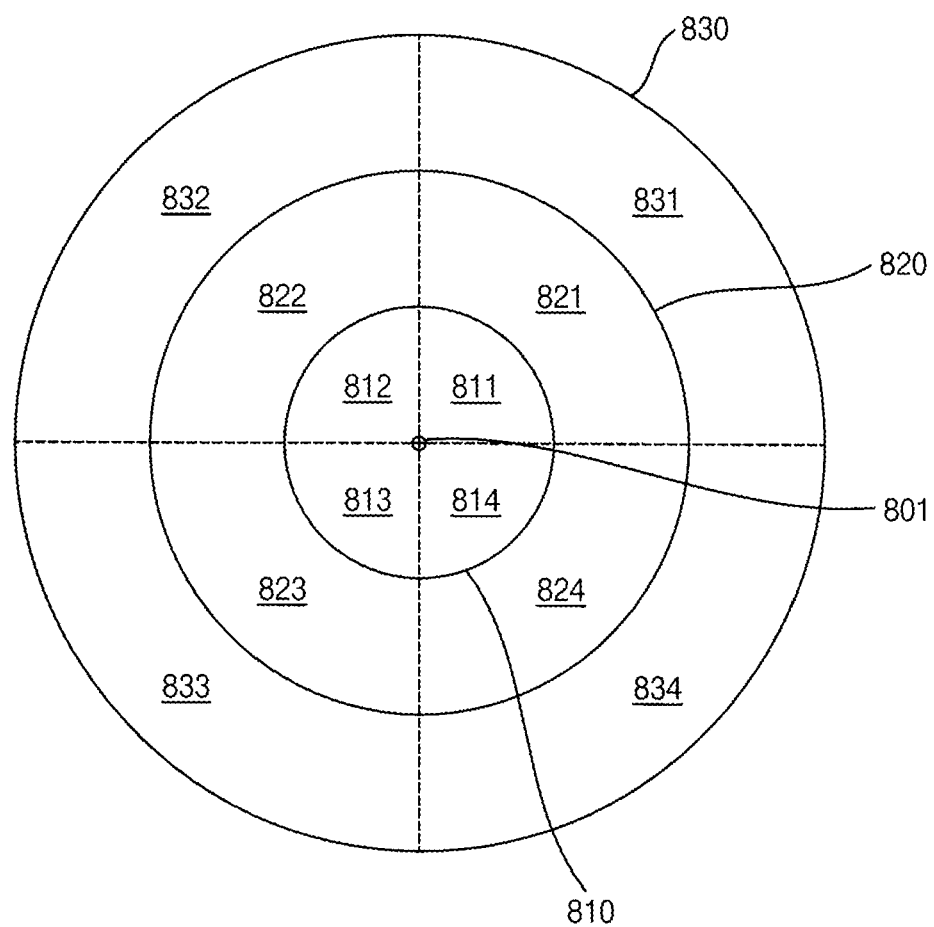
FIG. 8 is a diagram for describing still another example of a step of dividing a region including a stress detection point in a method of detecting stress according to some example embodiments.

FIG. 7 is a diagram for describing another example of a step of dividing a region including a stress detection point in a method of detecting stress according to some example embodiments, and FIG. 8 is a diagram for describing still another example of a step of dividing a region including a stress detection point in a method of detecting stress according to some example embodiments.

In some example embodiments, as illustrated in FIG. 7, to detect a stress level at each stress detection point 701, N rectangular shaped regions having different sizes may be determined such that each of the N rectangular shaped regions has the stress detection point 701 as the central point, and each of the N rectangular shaped regions may be substantially equally divided into M divided regions. For example, a first region 710 having a first size may be substantially equally divided into first through eighth divided regions 711, 712, 713, 714, 715, 716, 717, and 718; a second region 720 having a second size greater than the first size may be substantially equally divided into ninth through sixteenth divided regions 721, 722, 723, 724, 725, 726, 727, and 728; and a third region 730 having a third size greater than the second size may be substantially equally divided into seventeenth through twenty-fourth divided regions 731, 732, 733, 734, 735, 736, 737, and 738.

In some example embodiments, as illustrated in FIG. 8, to detect a stress level at each stress detection point 801, N circular shaped regions having different sizes may be determined such that each of the N circular shaped regions has the stress detection point 801 as the central point, and each of the N circular shaped regions may be substantially equally divided into M divided regions. For example, a first region 810 having a first size may be substantially equally divided into first through fourth divided regions 811, 812, 813, and 814; a second region 820 having a second size greater than the first size may be substantially equally divided into fifth through eighth divided regions 821, 822, 823, and 824; and a third region 830 having a third size greater than the second size may be substantially equally divided into ninth through twelfth divided regions 831, 832, 833, and 834.

Although FIGS. 3, 7, and 8 illustrate examples where three regions having different sizes are divided with respect to each detection point, according to some example embodiments, the number of the regions, or N, may be any integer greater than 0. Further, although FIGS. 3 and 8 illustrate examples where each region is divided into 4 divided regions, and FIG. 7 illustrates an example where each region is divided into 8 divided regions, according to some example embodiments, the number of the divided regions for each region, or M, may be any integer greater than 1. Further, although FIGS. 3 and 7 illustrate examples where at least one rectangular shaped region including the stress detection point is divided, and FIG. 8 illustrates an example where at least one circular shaped region including the stress detection point is divided, according to some example embodiments, the region including the stress detection point may have any shape.

Figure 9:
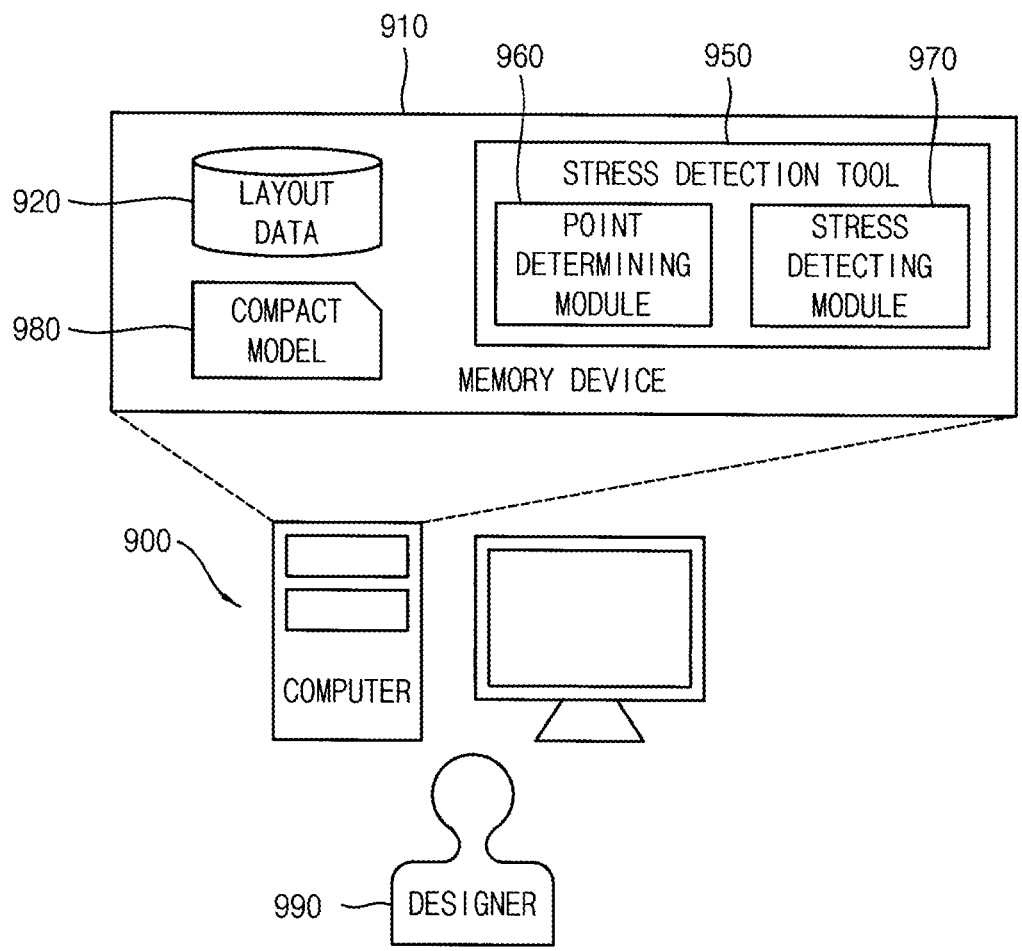
FIG. 9 is a diagram illustrating a computing system that detects stress of an integrated circuit according to some example embodiments.

FIG. 9 is a diagram illustrating a computing system that detects stress of an integrated circuit according to some example embodiments.

Referring to FIG. 9, a computing system 900 may detect stress of an integrated circuit including first and second patterns formed from different materials. The computing system 900 may include a memory device 910 into which layout data 920 for the integrated circuit and a stress detection tool 950 for detecting the stress of the integrated circuit are loaded, and a processor that executes the stress detection tool 950 loaded into the memory device 910.

The memory device 910 may be a main memory of the computing system 900, and may store data required for operations of the computing system 900. In some example embodiments, the memory device 910 may be implemented by a volatile memory, such as a dynamic random access memory (DRAM), a static random access memory (SRAM), a mobile dynamic random access memory (mobile DRAM), a dual data rate (DDR) synchronous DRAM (SDRAM), a low power DDR (LPDDR) SDRAM, a graphics DDR (GDDR) SDRAM, a Rambus DRAM (RDRAM), etc.

The processor may load the layout data 920 for the integrated circuit and the stress detection tool 950 from a storage device, such as a solid state drive (SSD), a hard disk drive (HDD), a memory card, a compact disc read-only memory (CD-ROM), etc., into the memory device 910. In some example embodiments, the layout data 920 may be generated using a hardware description language (HDL). For example, the layout data 920 may be Verilog layout data, Very High Speed Integrated Circuit (VHSIC) Hardware Description Language (VHDL) layout data, or the like.

The processor may execute the stress detection tool 950 loaded into the memory device 910. The stress detection tool 950 may determine at least one stress detection point based on the layout data 920, and may detect a stress level at the stress detection point by using a compact model 980. Here, the compact model 980 may be an equation or information about the equation of areas of the second pattern at divided regions for the stress detection point. According to some example embodiments, the compact model 980 may be a program code included in the stress detection tool 950, or may be implemented as a separate electronic file from an electronic file of the stress detection tool 950. In some example embodiments, the stress detection tool 950 may include a point determining module 960 and a stress detecting module 970.

The point determining module 960 may determine at least one stress detection point of the first pattern based on the layout data 920. By using the compact model 980, the stress detecting module 970 may divide a region including the stress detection point into a plurality of divided regions, may calculate areas of the second pattern at the divided regions, respectively, and may detect a stress level applied to the stress detection point of the first pattern by the second pattern based on the areas of the second pattern at the divided regions.

In some example embodiments, the stress detection tool 950 may add a layer representing the stress level to the layout data 920, and may inform a designer 990 which position of the integrated circuit has a high stress level by using the added layer. For example, the added layer may mark the position having the high stress level with a desired color (that may or may not be predetermined) or a desired value (that may or may not be predetermined).

As described above, the computing system 900 for detecting the stress of the integrated circuit according to some example embodiments may detect the stress level at each stress detection point by using the equation of the areas of the second pattern at the divided regions for each stress detection point, or by using the area-based compact model. Accordingly, the computing system 900 may rapidly detect the stress level, and a full-chip stress simulation that detects the stress throughout the whole region of the integrated circuit may be performed.

Figure 10:
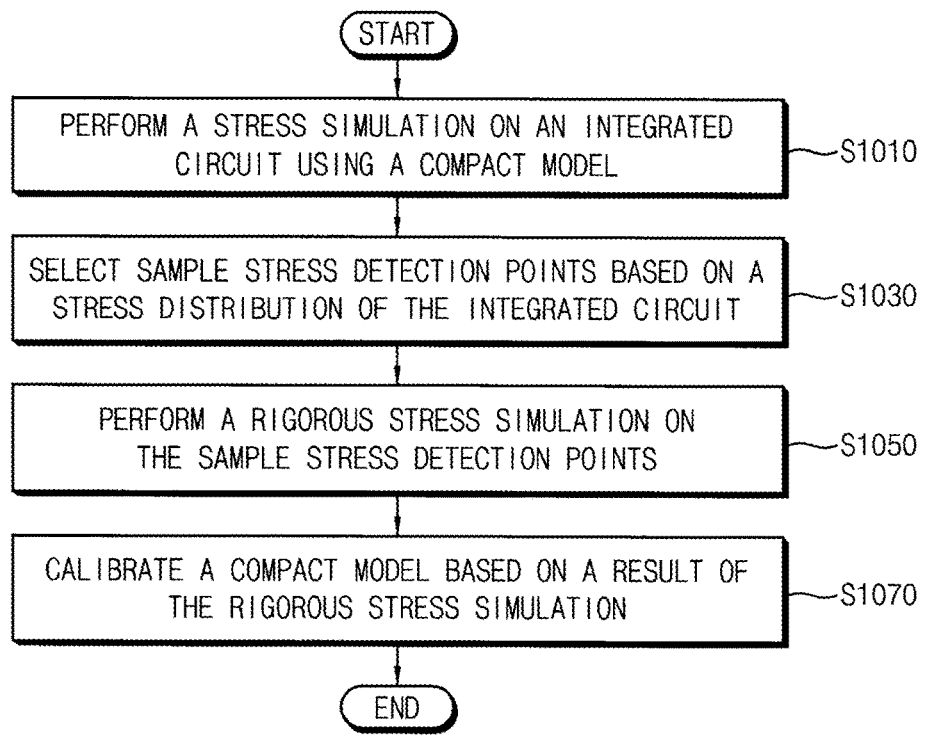
FIG. 10 is a flowchart illustrating a method of training a compact model for detecting stress of an integrated circuit according to some example embodiments.
Figure 11A:
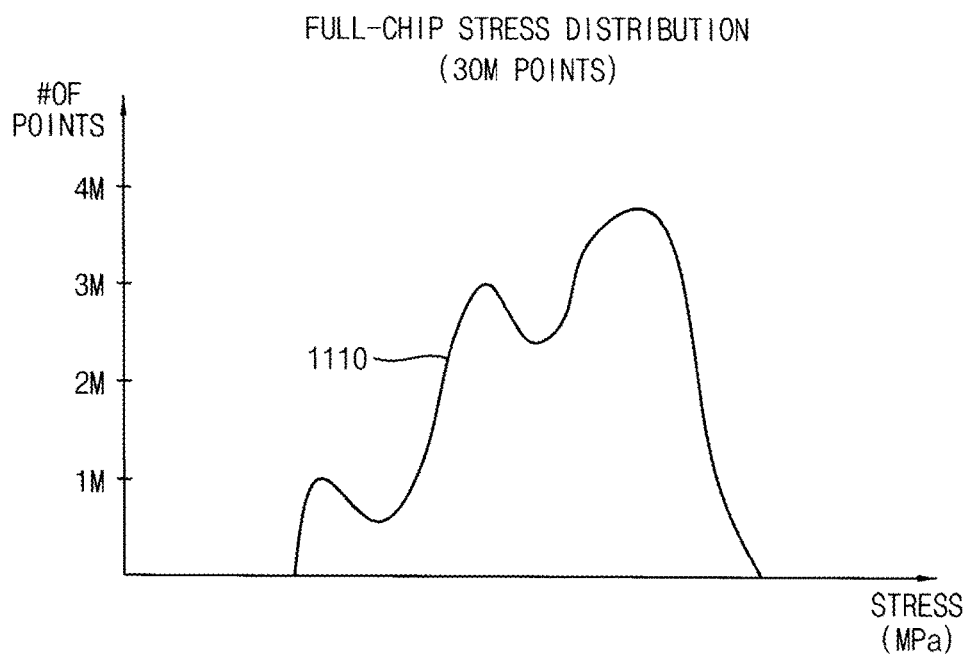
FIG. 11A is a graph illustrating a full-chip stress distribution of an integrated circuit.
Figure 11B:
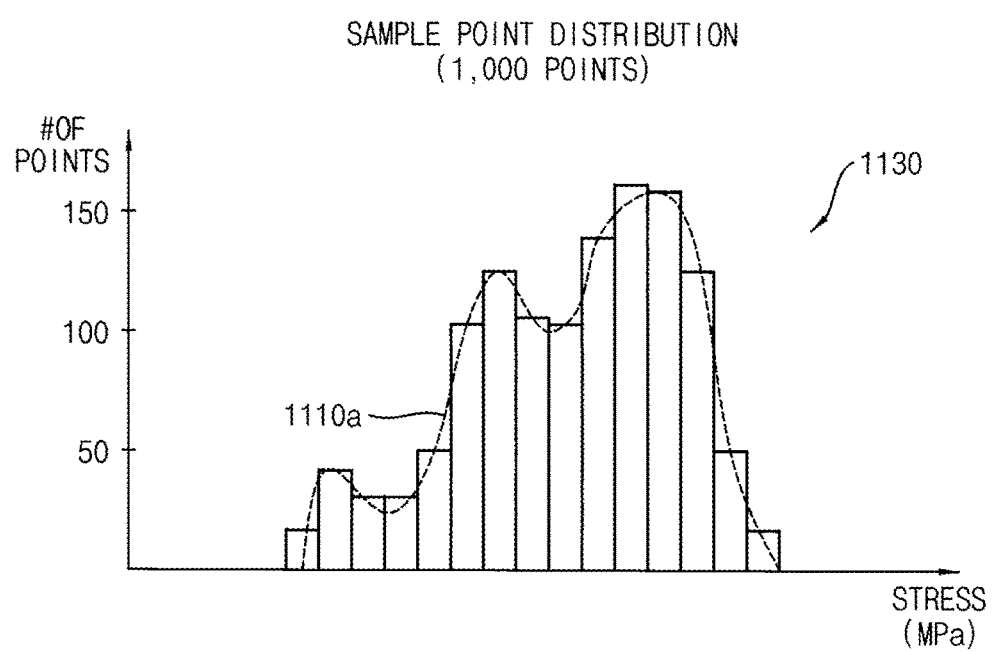
FIG. 11B is a graph illustrating a distribution of sample stress detection points.

FIG. 10 is a flowchart illustrating a method of training a compact model for detecting stress of an integrated circuit according to some example embodiments, FIG. 11A is a graph illustrating a full-chip stress distribution of an integrated circuit, and FIG. 11B is a graph illustrating a distribution of sample stress detection points.

Referring to FIG. 10, in a method of training a compact model for detecting stress of an integrated circuit, a compact model-based stress simulation may be performed on the integrated circuit to extract a stress distribution of the integrated circuit (S1010). In some example embodiments, the compact model-based stress simulation may be a full-chip stress simulation for the integrated circuit using the compact model, such as the compact model illustrated in FIG. 4 or FIG. 6. For example, stress levels at all stress detection points (e.g., all convex points, all concave points, and all projected points of a first pattern) throughout the whole region of the integrated circuit may be detected by a stress detection method illustrated in FIG. 1.

Sample stress detection points may be selected based on the stress distribution of the integrated circuit extracted by the compact model-based stress simulation (S1030). In some example embodiments, the stress distribution of the integrated circuit may be a full-chip stress distribution of the integrated circuit, and the sample stress detection points may be selected based on the full-chip stress distribution of the integrated circuit. For example, in a case where a full-chip stress distribution 1110 illustrated in FIG. 11A is extracted as a result of the compact model-based stress simulation, the sample stress detection points may be selected such that a sample point distribution 1130 (or a distribution of the sample stress detection points) has a similar shape to that of a full-chip stress distribution 1110a, as illustrated in FIG. 11B. In an example, when selecting 1,000 sample stress detection points from a total of 30 million (30 M) stress detection points of the integrated circuit, the sample stress detection points may be selected such that the sample point distribution 1130 of the 1,000 sample stress detection points has the substantially the same shape as that of a scaled-down full-chip stress distribution 1110a. The vertical axis of the distribution is graduated at one million (1 M) points, two million (2 M) points, three million (3 M) points, and four million (4 M) points.

A rigorous stress simulation may be performed on the sample stress detection points (S1050). For example, the rigorous stress simulation may be performed using a finite element method (FEM) or a finite analytic method (FAM).

The compact model may be calibrated based on a result of the rigorous stress simulation (S1070). For example, the compact model may be an equation of areas of a pattern at divided regions for each stress detection point, and coefficients of the equation may be calibrated based on the result of the rigorous stress simulation. For example, the coefficients of the equation may be calibrated using a root-mean-square (RMS) method or the like such that stress levels at 1,000 sample stress detection points calculated using the equation may approximate the result of the rigorous stress simulation at the sample stress detection points.

As described above, in the method of training the compact model according to some example embodiments, the sample stress detection points at which the rigorous stress simulation is to be performed are selected based on the stress distribution (e.g., the full-chip stress distribution) of the integrated circuit and, thus, the accuracy of the compact model may be improved in all stress ranges of the integrated circuit. Further, unlike a typical training method that compares a value obtained by a compact model with an actual measured value, the method of training the compact model according to some example embodiments may be performed based on a comparison of the value obtained by the compact model and a value obtained by a simulation (e.g., the rigorous stress simulation).

Figure 12:
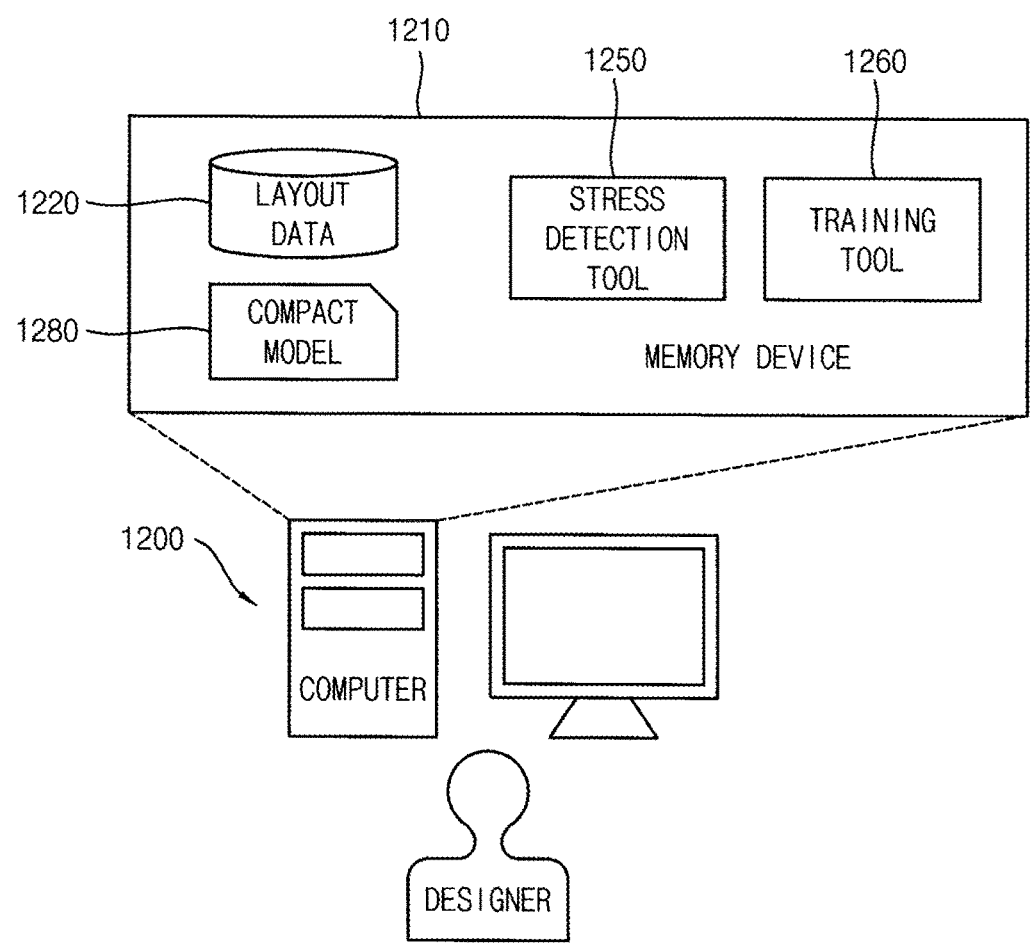
FIG. 12 is a diagram illustrating a computing system that trains a compact model for detecting stress of an integrated circuit according to some example embodiments.

FIG. 12 is a diagram illustrating a computing system that trains a compact model for detecting stress of an integrated circuit according to some example embodiments.

Referring to FIG. 12, a computing system 1200 that trains a compact model 1280 for detecting stress of an integrated circuit may include a memory device 1210 into which layout data 1220 for the integrated circuit, the compact model 1280, a stress detection tool 1250 for detecting the stress of the integrated circuit, and a training tool 1260 for training the compact model 1280 are loaded, and a processor that executes the stress detection tool 1250 and the training tool 1260 loaded into the memory device 1210. According to some example embodiments, the stress detection tool 1250 and the training tool 1260 may be implemented as a single electronic file, or may be implemented as separate electronic files.

The stress detection tool 1250 executed by the processor may perform a stress simulation (e.g., a full-chip stress simulation) on the integrated circuit by using the compact model 1280. For example, the stress detection tool 1250 may detect stress levels at all stress detection points (e.g., all convex points, all concave points, and all projected points) of the integrated circuit. A stress distribution (e.g., a full-chip stress distribution) of the integrated circuit may be extracted by the stress simulation.

The training tool 1260 executed by the processor may select sample stress detection points based on the stress distribution (e.g., the full-chip stress distribution) of the integrated circuit, may perform a rigorous stress simulation on the sample stress detection points, and may calibrate the compact model 1280 based on a result of the rigorous stress simulation.

Figure 13:
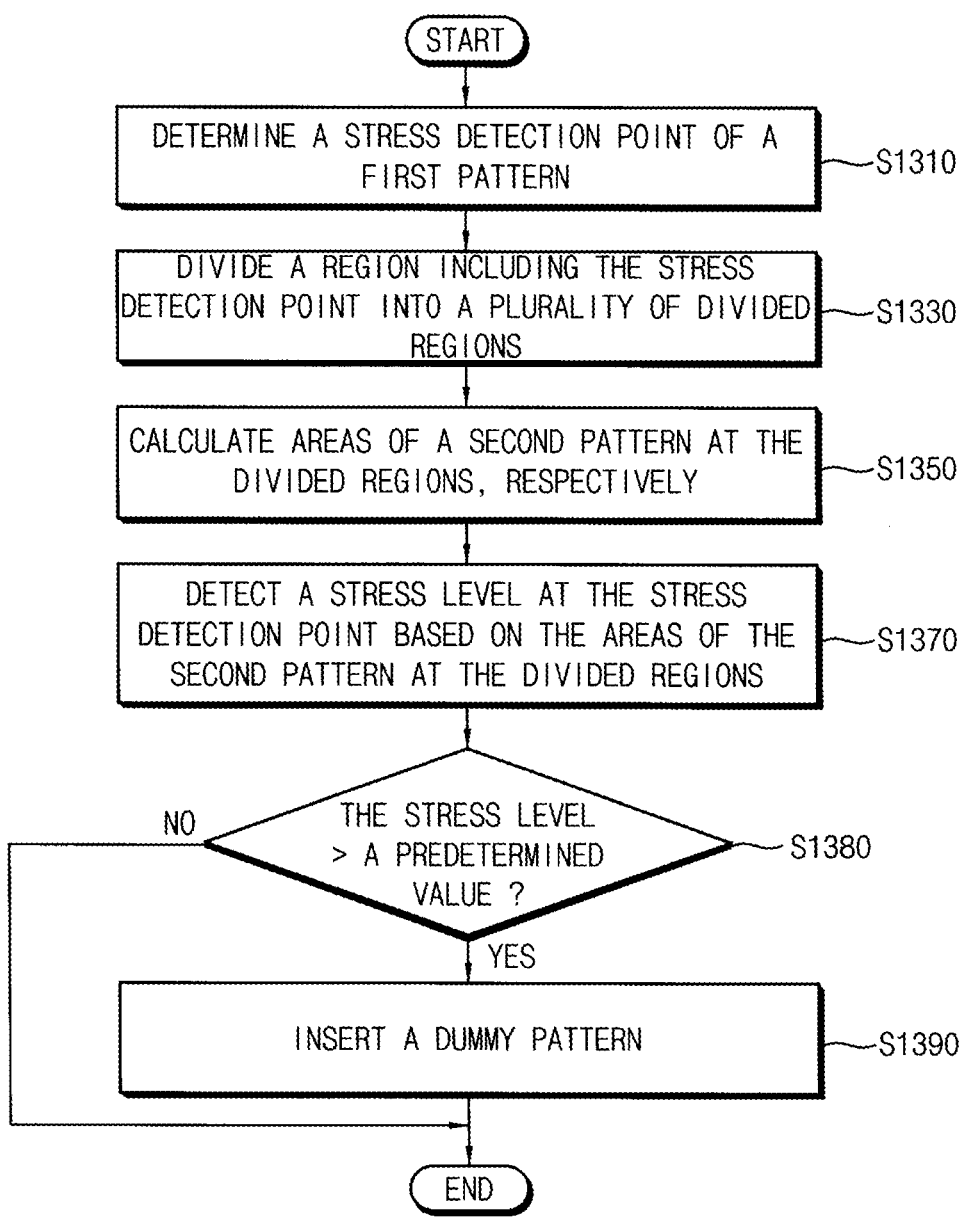
FIG. 13 is a flowchart illustrating a method of relaxing stress of an integrated circuit according to some example embodiments.

FIG. 13 is a flowchart illustrating a method of relaxing stress of an integrated circuit according to some example embodiments, and FIGS. 14A through 14D are diagrams illustrating examples of dummy patterns inserted by a method of relaxing stress according to some example embodiments.

Referring to FIG. 13, in an integrated circuit including first and second patterns that are adjacent to each other and are formed from different materials, at least one stress detection point of the first pattern may be determined (S1310). In some example embodiments, to perform the full-chip stress simulation on the integrated circuit, stress levels may be detected at all stress detection points throughout the whole region of the integrated circuit. A region including each stress detection point may be divided into a plurality of divided regions (S1330), areas of the second pattern may be calculated at the divided regions, respectively (S1350), and a stress level applied to each stress detection point of the first pattern by the second pattern may be calculated based on the areas of the second pattern at the divided regions (S1370).

If the detected stress level at each stress detection point is less than or equal to a desired value (that may or may not be predetermined) (S1380: NO), a layout for the region including the stress detection point may not be changed. If the detected stress level at one or more stress detection points is greater than the desired value (that may or may not be predetermined) (S1380: YES), a dummy pattern may be inserted near the stress detection point of the first pattern (S1390). In some example embodiments, the dummy pattern may be formed from the same material as the first pattern. In some example embodiments, the dummy pattern may be a ring type dummy pattern, a rectangle type dummy pattern, a polygon type dummy pattern, an attached type dummy pattern, or the like.

Figure 14A:
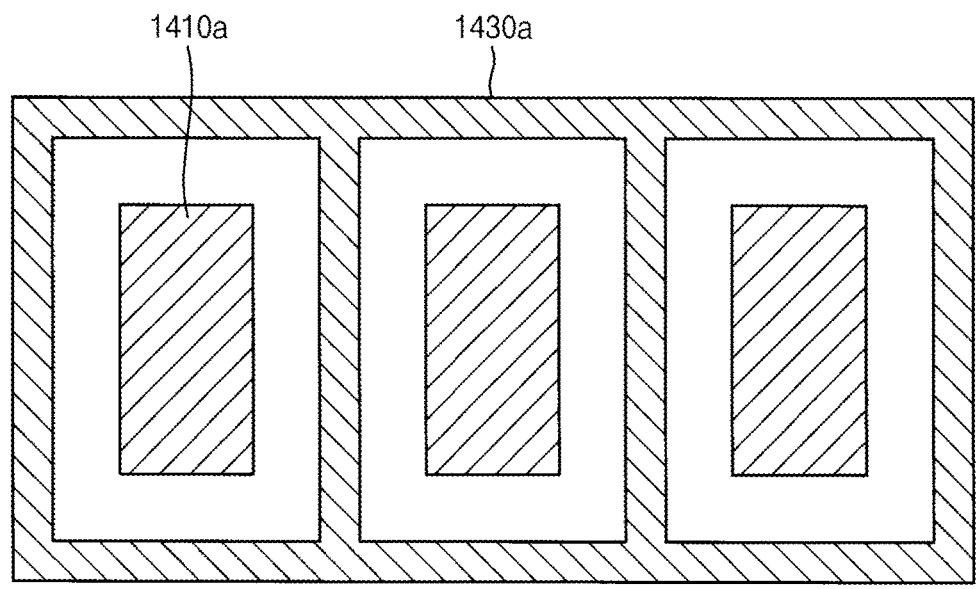
FIGS. 14A through 14D are diagrams illustrating examples of dummy patterns inserted by a method of relaxing stress according to some example embodiments.
Figure 14B:
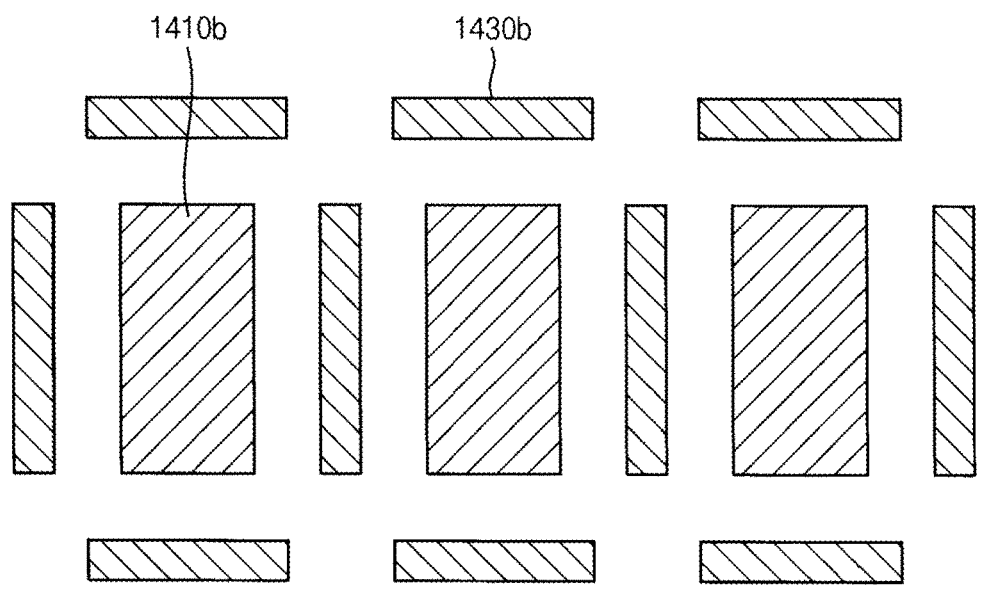
Figure 14C:
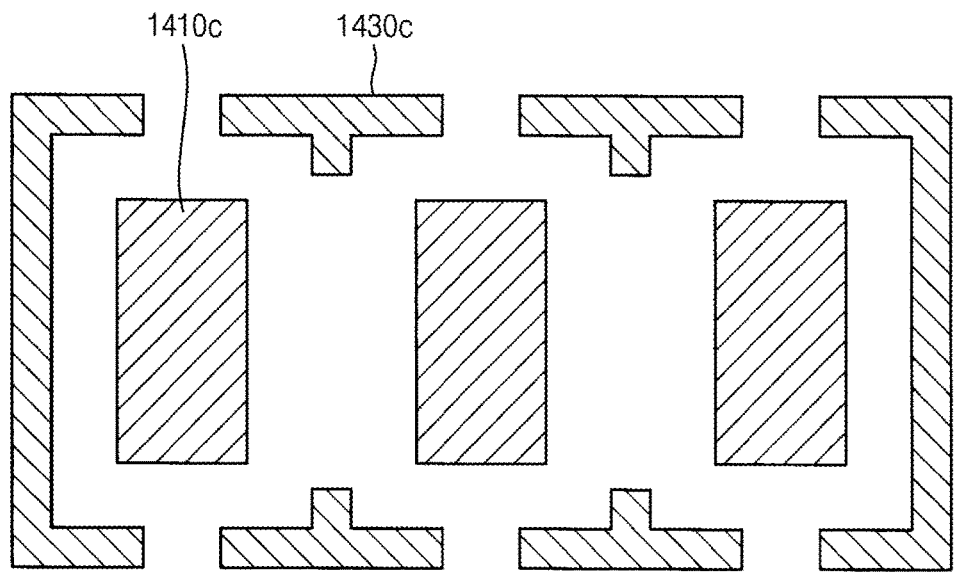
Figure 14D:
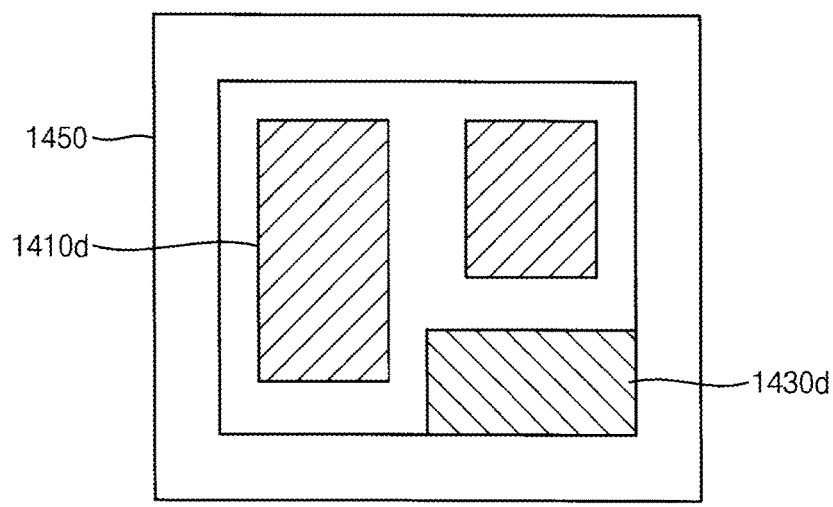

In some example embodiments, as illustrated in FIG. 14A, a ring type dummy pattern 1430a may be added to a layout data for the integrated circuit such that the ring type dummy pattern 1430a surrounds a region 1410a of the first pattern including the stress detection point having the stress level greater than the desired value (that may or may not be predetermined). In some example embodiments, as illustrated in FIG. 14B, a rectangle type dummy pattern 1430b may be added to the layout data for the integrated circuit such that the rectangle type dummy pattern 1430b is located near or around a region 1410b of the first pattern including the stress detection point having the stress level greater than the desired value (that may or may not be predetermined). In some example embodiments, as illustrated in FIG. 14C, a polygon type dummy pattern 1430c may be added to the layout data for the integrated circuit such that the polygon type dummy pattern 1430c is located near or around a region 1410c of the first pattern including the stress detection point having the stress level greater than the desired value (that may or may not be predetermined). In some example embodiments, as illustrated in FIG. 14D, an attached type dummy pattern 1430d may be added to the layout data for the integrated circuit such that the attached type dummy pattern 1430d is attached to a wiring 1450 (e.g., an active guard ring pattern) surrounding a region 1410d of the first pattern including the stress detection point having the stress level greater than the desired value (that may or may not be predetermined).

As described above, the dummy pattern may be inserted near the stress detection point and, thus, the area of the second pattern near the stress detection point may be reduced, which may result in a reduction of the stress level at the stress detection point. Accordingly, a dislocation or a crack of the integrated circuit may be prevented.

Figure 15:
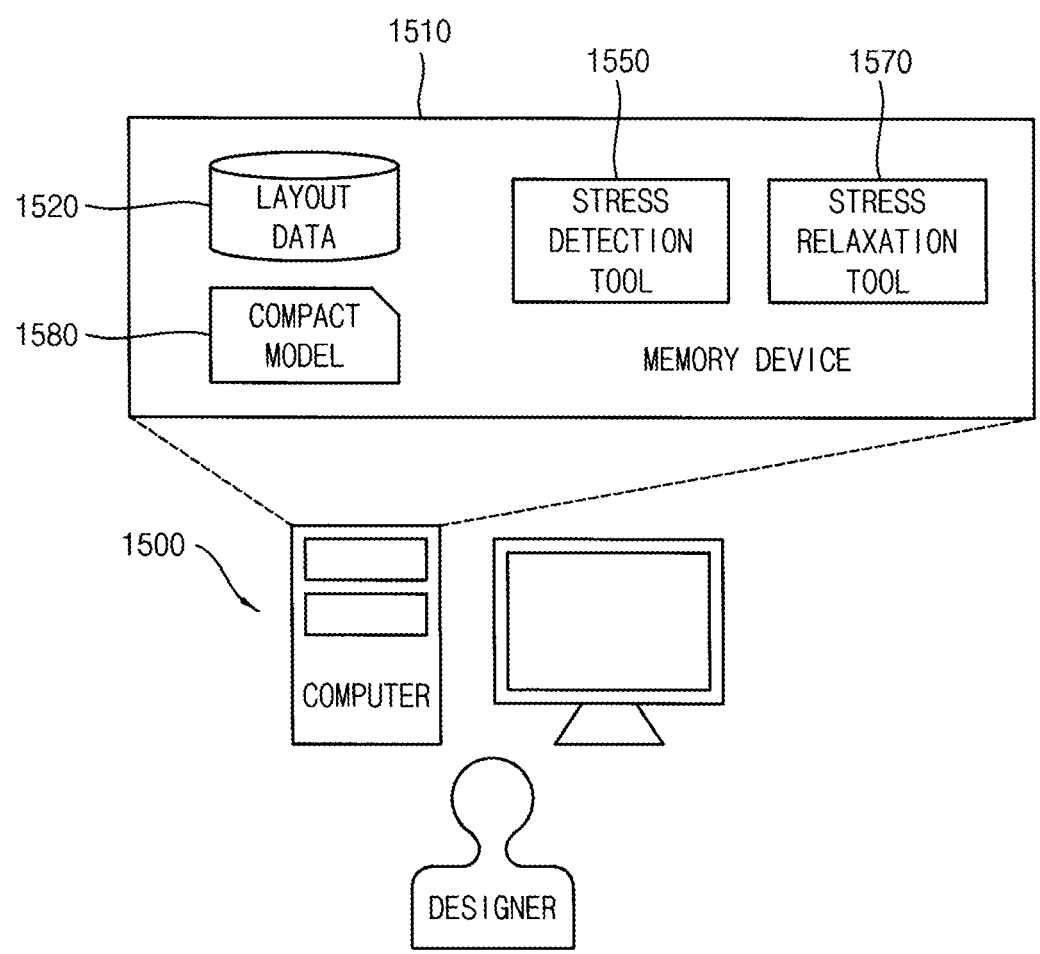
FIG. 15 is a diagram illustrating a computing system that relaxes stress of an integrated circuit according to some example embodiments.

FIG. 15 is a diagram illustrating a computing system that relaxes stress of an integrated circuit according to some example embodiments.

Referring to FIG. 15, a computing system 1500 that relaxes stress of an integrated circuit that are formed from different materials may include a memory device 1510 into which layout data 1520 for the integrated circuit, a stress detection tool 1550 for detecting the stress of the integrated circuit, and a stress relaxation tool 1570 for relaxing the detected stress, and a processor that executes the stress detection tool 1550 and the stress relaxation tool 1570 loaded into the memory device 1510. According to some example embodiments, the stress detection tool 1550 and the stress relaxation tool 1570 may be implemented as a single electronic file, or may be implemented as separate electronic files.

The stress detection tool 1550 executed by the processor may detect the stress of the integrated circuit by using a compact model 1580. For example, the stress detection tool 1550 may determine at least one stress detection point of the first pattern based on the layout data 1520, may divide a region including the stress detection point into a plurality of divided regions, may calculate areas of the second pattern at the divided regions, respectively, and may detect a stress level applied to the stress detection point of the first pattern by the second pattern based on the areas of the second pattern at the divided regions.

The stress relaxation tool 1570 executed by the processor may modify the layout data 1520 for the integrated circuit to insert a dummy pattern near the stress detection point of the first pattern when the detected stress level is greater than a desired value (that may or may not be predetermined). For example, as illustrated in FIGS. 14A through 14D, the stress relaxation tool 1570 may insert a ring type dummy pattern 1430a, a rectangle type dummy pattern 1430b, a polygon type dummy pattern 1430c, an attached type dummy pattern 1430d, or the like. Accordingly, a dislocation or a crack of the integrated circuit may be prevented.

The present inventive concept may be applied to any semiconductor circuit design and verification tool, device, system, or method. For example, the present inventive concept may be applied to an integrated circuit, or a verification tool or device for the integrated circuit.

The algorithms discussed in this application (e.g., for detecting stresses, for training compact models, and for relaxing stresses) may be used in more general purpose apparatuses and/or methods of controlling apparatuses. For example, the algorithms may be used in apparatuses for more general electrical or electronic systems and/or for controlling such apparatuses for detection, training, and/or adjusting.

The methods described above may be written as computer programs and can be implemented in general-use digital computers that execute the programs using a computer-readable recording medium. In addition, a structure of data used in the methods may be recorded in a computer-readable recording medium in various ways. Examples of the computer-readable recording medium include storage media such as magnetic storage media (e.g., ROM (Read-Only Memory), RAM (Random-Access Memory), USB (Universal Serial Bus), floppy disks, hard disks, etc.) and optical recording media (e.g., CD-ROMs (Compact Disc Read-Only Memories) or DVDs (Digital Video Discs)).

In addition, some example embodiments may also be implemented through computer-readable code/instructions in/on a medium (e.g., a computer-readable medium) to control at least one processing element to implement some example embodiments. The medium may correspond to any medium/media permitting the storage and/or transmission of the computer-readable code.

The computer-readable code may be recorded/transferred on a medium in a variety of ways, with examples of the medium including recording media, such as magnetic storage media (e.g., ROM, floppy disks, hard disks, etc.) and optical recording media (e.g., CD-ROMs or DVDs), and transmission media such as Internet transmission media. Thus, the medium may be such a defined and measurable structure including or carrying a signal or information, such as a device carrying a bitstream according to some example embodiments. The media may also be a distributed network, so that the computer-readable code is stored/transferred and executed in a distributed fashion. Furthermore, the processing element could include a processor or a computer processor, and processing elements may be distributed and/or included in a single device.

In some example embodiments, some of the elements may be implemented as a 'module'. According to some example embodiments, 'module' may be interpreted as software-based components or hardware components, such as a field programmable gate array (FPGA) or an application specific integrated circuit (ASIC), and the module may perform certain functions. However, the module is not limited to software or hardware. The module may be configured so as to be placed in a storage medium which may perform addressing, or to execute one or more processes.

For example, modules may include components such as software components, object-oriented software components, class components, and task components, processes, functions, attributes, procedures, subroutines, segments of program code, drivers, firmware, microcodes, circuits, data, databases, data structures, tables, arrays, and variables. Functions provided from the components and the modules may be combined into a smaller number of components and modules, or be separated into additional components and modules. Moreover, the components and the modules may execute one or more central processing units (CPUs) in a device.

Some example embodiments may be implemented through a medium including computer-readable codes/instructions to control at least one processing element of the above-described embodiment, for example, a computer-readable medium. Such a medium may correspond to a medium/media that may store and/or transmit the computer-readable codes.

The computer-readable codes may be recorded in a medium or be transmitted over the Internet. For example, the medium may include a ROM, a RAM, a CD-ROM, a magnetic tape, a floppy disc, an optical recording medium, or a carrier wave such as data transmission over the Internet. Further, the medium may be a non-transitory computer-readable medium. Since the medium may be a distributed network, the computer-readable code may be stored, transmitted, and executed in a distributed manner. Further, for example, the processing element may include a processor or a computer processor, and be distributed and/or included in one device.

It should be understood that the example embodiments described herein should be considered in a descriptive sense only and not for purposes of limitation. Descriptions of features or aspects within each embodiment should typically be considered as available for other similar features or aspects in other embodiments.

Although example embodiments have been shown and described, it would be appreciated by those skilled in the art that changes may be made in these example embodiments without departing from the principles and spirit of the disclosure, the scope of which is defined by the claims and their equivalents.

What is claimed is:

1. A method of detecting stress of an integrated circuit including first and second patterns formed from different materials, the method comprising:
    determining one or more stress detection points of the first pattern;
    determining N regions such that each region of the N regions has a first stress detection point of the one or more stress detection points as a central point, where N is an integer greater than 0;
    dividing each region of the N regions into M divided regions, where M is an integer greater than 1;
    calculating areas of the second pattern at the M divided regions; and
    detecting a stress level applied to the first stress detection point of the first pattern by the second pattern based on the areas of the second pattern at the M divided regions.

2. The method of claim 1, wherein the first stress detection point includes at least one point of a convex point of the first pattern, a concave point of the first pattern, and a projected point of the first pattern.

3. The method of claim 1, wherein the determining of the one or more stress detection points and the detecting of the stress level are performed throughout a whole region of the integrated circuit.

4. The method of claim 1, wherein,
    the determining the N regions includes determining a rectangular shaped region having the first stress detection point as a central point; and
    the dividing each of the N regions into M divided regions includes dividing the rectangular shaped region into first through fourth divided regions.

5. The method of claim 4, wherein the detecting of the stress level includes
    calculating, as the stress level, a sum of a first coefficient, a product of a second coefficient and the area of the second pattern at the first divided region, a product of a third coefficient and the area of the second pattern at the second divided region, a product of a fourth coefficient and the area of the second pattern at the third divided region, and a product of a fifth coefficient and the area of the second pattern at the fourth divided region.

6. The method of claim 1, wherein,
    the N regions are N rectangular shaped regions having different sizes such that each rectangular shaped region of the N rectangular shaped regions has the first stress detection point as a central point.

7. The method of claim 6, wherein the detecting of the stress level includes,
    calculating the stress level by using an L-th order equation of the areas of the second pattern at the M divided regions, where L is an integer greater than 0.

8. The method of claim 1, wherein,
    the N regions are N circular shaped regions having different sizes such that each circular shaped region of the N circular shaped regions has the first stress detection point as a central point.

9. The method of claim 1, wherein,
    the first pattern is an active pattern,
    the second pattern is an isolation layer pattern, and
    the stress level applied to the first stress detection point of the active pattern by the isolation layer pattern is detected.

10. A computing system that is configured to detect stress of an integrated circuit including first and second patterns formed from different materials, the computing system comprising:
    a memory device into which layout data for the integrated circuit and a stress detection tool for detecting the stress of the integrated circuit are loaded; and
    a processor configured to execute the stress detection tool loaded into the memory device to
        determine one or more stress detection points of the first pattern based on the layout data,
        determine N regions such that each region of the N regions has a first stress detection point of the one or more stress detection points as a central point, where N is an integer greater than 0,
        divide each region of the N regions into M divided regions, where M is an integer greater than 1,
        calculate areas of the second pattern at the M divided regions, and
        detect a stress level applied to the first stress detection point of the first pattern by the second pattern based on the areas of the second pattern at the M divided regions.

11. The computing system of claim 10, wherein the processor is further configured to execute the stress detection tool loaded into the memory device to
- determine the first stress detection point of the first pattern based on the layout data; and
- divide each N region including the first stress detection point into the M divided regions,
- calculate the areas of the second pattern at the M divided regions, and
- detect the stress level applied to the first stress detection point of the first pattern by the second pattern based on the areas of the second pattern at the M divided regions.

12. The computing system of claim 10, wherein processor configured to execute the stress detection tool loaded into the memory device to add a layer representing the stress level to the layout data.

13. A method of detecting stress of an integrated circuit including patterns of different materials, the method comprising:
- determining one or more first stress detection points of a first pattern;
- determining N regions such that each region of the N regions has a first stress detection point of the one or more first stress detection points as a central point, where N is an integer greater than 0;
- dividing each region of the N regions of the integrated circuit, including the one or more first stress detection points, into M divided first regions, where M is an integer greater than 1;
- calculating areas of a second pattern in the M divided first regions; and
- detecting a stress applied to the first stress detection point by the second pattern based on the areas of the second pattern in the M divided first regions.

14. The method of claim 13, wherein the first stress detection point includes at least one point of a convex point of the first pattern, a concave point of the first pattern, and a projected point of the first pattern.

15. The method of claim 13, further comprising:
- determining a second stress detection point of the first pattern;
- dividing a second region of the integrated circuit, including the second stress detection point, into divided second regions;
- calculating areas of the second pattern in the divided second regions; and
- detecting a stress applied to the second stress detection point by the second pattern based on the areas of the second pattern in the divided second regions.

16. The method of claim 15, wherein the second stress detection point includes at least one point of a convex point of the first pattern, a concave point of the first pattern, and a projected point of the first pattern.

17. The method of claim 15, wherein at least one region of the M divided first regions and the second region overlap.

18. The method of claim 15, wherein at least one region of the M divided first regions and the second region do not overlap.

19. The method of claim 15, wherein at least one region of the M divided first regions overlaps at least one region of the divided second regions.

20. The method of claim 15, wherein none of the M divided first regions overlaps any region of the divided second regions.

* * * * *